United States Patent [19]

Takada

[11] Patent Number: 5,416,352

[45] Date of Patent: May 16, 1995

[54] GATE ELECTRODE FORMED ON A REGION RANGING FROM A GATE INSULATING FILM TO A FIELD INSULATING FILM

[75] Inventor: Kazuhiko Takada, Kawasaki, Japan

[73] Assignee: Fujitsu Limited, Kawasaki, Japan

[21] Appl. No.: 260,983

[22] Filed: Jun. 15, 1994

[30] Foreign Application Priority Data

Sep. 8, 1993 [JP] Japan .................. 5-223722

[51] Int. Cl.⁶ .................. H01L 29/06; H01L 29/78
[52] U.S. Cl. .................. 257/413; 257/364; 257/412; 257/655; 257/755; 257/757; 257/764
[58] Field of Search .......... 257/364, 412, 413, 655, 257/755, 757, 764

[56] References Cited

U.S. PATENT DOCUMENTS 4,894,689 1/1990 Cooper, Jr. et al. .................. 257/364

FOREIGN PATENT DOCUMENTS 55-113375 9/1980 Japan .................. 257/364

OTHER PUBLICATIONS

"Elimination of Stacking Faults in Silicon Wafers by HCl Added Dry O₂ Oxidation", Shiraki, Japanese Journal of Applied Physics, vol. 14, No. 6, Jun., 1975, pp. 747–752.

Primary Examiner—Ngân V. Ngô
Attorney, Agent, or Firm—Nikaido, Marmelstein, Murray & Oram

[57] ABSTRACT

The invention relates to a semiconductor device having an electrode formed on an region ranging from its thin insulating film in an element forming region to its thick insulating film in an isolation region, and it is an object of the invention to provide a semiconductor device capable of improving dielectric strength of a thin insulating film under a electrode in the boundary region between a thin insulating film and a thick insulating film as well as improving the film quality of the thin insulating film. A semiconductor device according to the present invention comprises a thick insulating film partly formed on a semiconductor substrate, a thin insulating film formed on the semiconductor substrate adjacent to the thick insulating film, a first electrode layer composed of a semiconductor layer which is formed in a region ranging from the thin insulating film to the thick insulating film and has a higher resistance in a boundary region between the thin insulating film and the thick insulating film and a lower resistance except for the boundary region, and a second electrode layer formed on the first electrode layer.

17 Claims, 5 Drawing Sheets

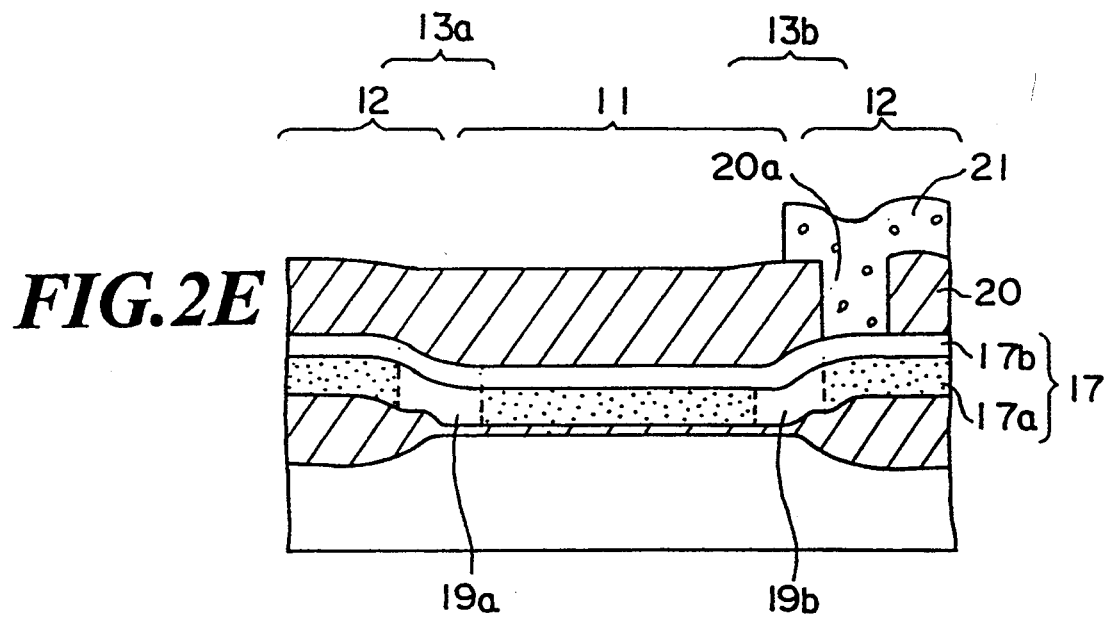

GATE ELECTRODE FORMED ON A REGION RANGING FROM A GATE INSULATING FILM TO A FIELD INSULATING FILM

BACKGROUND OF THE INVENTION

1. Field of the Invention

The invention relates to a semiconductor device and a method of manufacturing a semiconductor device, and more particularly to an insulated gate field effect transistor and a method of manufacturing an insulated gate field effect transistor having an gate electrode formed on an region ranging from a gate insulating film in an element forming region to a field insulating film in an isolation region.

2. Description of the Prior Art

In recent years, with the increasing speed of an insulated gate field effect transistor, its gate electrode has been made finer and its gate insulating film has been made thinner. Therefore, the electric field strength applied to the gate insulating film has a tendency to increase, and so it has been desired to improve the gate insulating film in dielectric strength and reliability.

By now, in order to improve a gate insulating film in dielectric strength, such a measure has been taken as decreasing interface states by adding gas containing chromium (C1) ions to oxygen ($O_2$) when forming the gate insulating film as shown on page 747 to 752 in *JAPANESE JOURNAL OF APPLIED PHYSICS* Vol.14, No.6, June, 1975 by Hiromitsu SHIRAKI.

FIG. 1 is a cross-sectional view showing a hitherto insulated gate field effect transistor having a gate electrode formed on an region ranging from a gate insulating film in an element forming region to a field insulating film in an isolation region.

As shown in FIG. 1, a field oxide film 4 is formed on a part of a silicon substrate 3 in an isolation region 2 by means of local oxidation of silicon (LOCOS), and a gate oxide film 5 is formed by means of thermal oxidation on a part of the silicon substrate 3 in an element forming region 1 surrounded by the isolation region 2. At this time, in order to improve the gate oxide film 5 in dielectric strength, interface states are decreased by adding gas containing chromium ions to oxygen when forming the gate oxide film 5.

And in order to connect with elements existing in an adjoining element forming region, a gate electrode 6 is not only formed on the gate insulating film 5 in the element forming region 1 but also extended to the adjoining element forming region passing through on the field oxide film 4.

With making the gate electrode 6 finer, the gate electrode 6 needs to be made lower in resistance. For this purpose, a polycide layer composed of both a polycrystalline semiconductor layer 6a and a silicide layer 6b is used as the gate electrode 6. The polycrystalline semiconductor layer 6a is highly doped with impurities giving a certain conductive type (hereinafter referred to as conductive type impurities) in order to lower its resistance.

Besides, in FIG. 1, another reference number 7 is an interlayer insulating film and number 8 is an upper interconnection layer connected with the gate electrode 6 through a viahole 7a formed in the interlayer insulating film 7 on the gate electrode 6.

However, defects or interface states in the interface region between the field oxide film 4 and the gate oxide film 5 are not decreased in the same manner as decrease of defects or interface states in the element forming region 1.

The reason is thought that the stress which is caused by heating when forming the gate oxide film 5 is applied to the field oxide film 4 and left.

Thus, dielectric strength and reliability of the insulated gate field effect transistor are governed by defects and the like generated in the interface region in spite of improving the film quality of the gate oxide film 5.

Therefore, it has been desired to further improve dielectric strength and reliability of the insulated gate field effect transistor.

SUMMARY OF THE INVENTION

It is an object of the present invention to provide a semiconductor device and a method of manufacturing a semiconductor device capable of improving dielectric strength of an thin insulating layer under such an electrode as a gate electrode in the boundary region between a thick insulating film and a element forming region as well as improving the film quality of the thin insulating film.

In an semiconductor device according to the present invention, it has a two-layered electrode layer which composes a first electrode layer and the second electrode layer. And a semiconductor layer as a first electrode layer is higher in resistance in the boundary region between a thick insulating film and a thin insulating film and is lower in resistance in the element forming region except for the boundary region.

Since the semiconductor layer of high resistance in the boundary region acts as an insulating layer, the voltage is applied mainly to a second electrode layer in the boundary region when a voltage is applied to the electrode layers. At this time, the semiconductor layer of high resistance in the boundary region and the thin insulating film act equivalently to capacitors connected in series.

Accordingly, when a voltage is applied to the second electrode layer, the voltage is distributed between the semiconductor layer of high resistance and the thin insulating film according to their respective equivalent capacities. Therefore, a lower voltage than the whole voltage is applied to the thin insulating film. Thus, the electric field strength applied to the thin insulating film is considerably weakened in the boundary region. In this manner, dielectric strength of an semiconductor device can be improved.

And the second electrode layer connects each other the semiconductor layers with lower resistance separated by the semiconductor layer of higher resistance. Thus a specified voltage is uniformly applied to the electrodes all over the whole device.

A semiconductor layer of high resistance as described above is easily formed by doping the semiconductor layer with impurities giving one conductive type (hereinafter referred to as one conductive type impurities) except for the part of the semiconductor layer in the boundary region or by selectively doping the part of the semiconductor layer in the boundary region with impurities giving counter conductive type (hereinafter referred to as counter conductive type impurities) to compensate the one conductive type impurities after doping the whole semiconductor layer with one conductive type impurities.

BRIEF DESCRIPTION OF THE DRAWINGS

FIGS. 2A to 2E are cross-sectional views showing a method for manufacturing an insulated gate field effect transistor according to a first embodiment of the invention.

DESCRIPTION OF THE PREFERRED EMBODIMENTS OF THE INVENTION (1) First embodiment of the invention A first embodiment of the invention is described in the following with reference to FIGS. 2A to 2E and 3.

FIGS. 2A to 2E and 3 are cross-sectional views showing a method of manufacturing an insulated gate field effect transistor according to the first embodiment of the invention.

Figure 1:
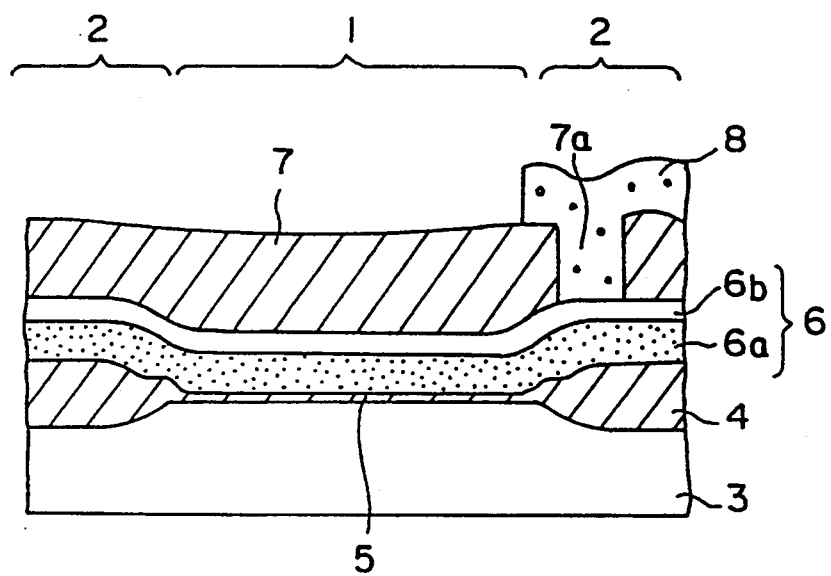
FIG. 1 is a cross-sectional view showing an insulated gate field effect transistor according to the prior art.
Figure 2A:
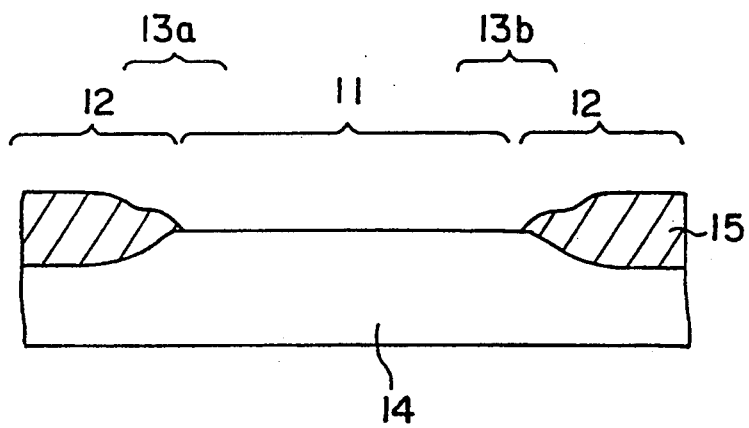

First, as shown in FIG. 2A, after forming an unshown silicon nitride film on a part of a silicon substrate (a first semiconductor layer) 14 to become a element forming region 11, the silicon substrate 14 is heated in an oxygen atmosphere. In this way, the region on the silicon substrate 14 where a silicon nitride film is not formed is oxidized to form a field insulating film (a thick insulating film) 15 composed of a silicon oxide film of about 600 nm in thickness. The region where the field insulating film 15 has been formed becomes an isolation region 12.

Figure 2B:
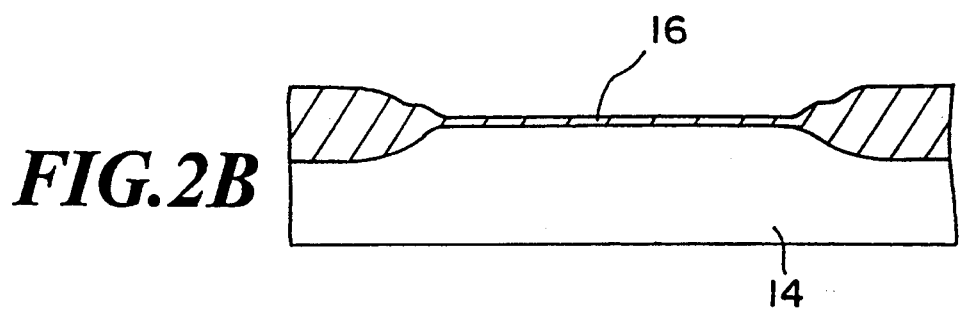

Next, after removing the silicon nitride film, as shown in FIG. 2B, the silicon substrate 14 is heated at a temperature of 1050° C. in an oxygen atmosphere. Thus, a gate insulating film (a thin insulating film) 16 composed of a silicon oxide film of about 11 nm in thickness is formed on the silicon substrate 14 in an element forming region.

Figure 2C:
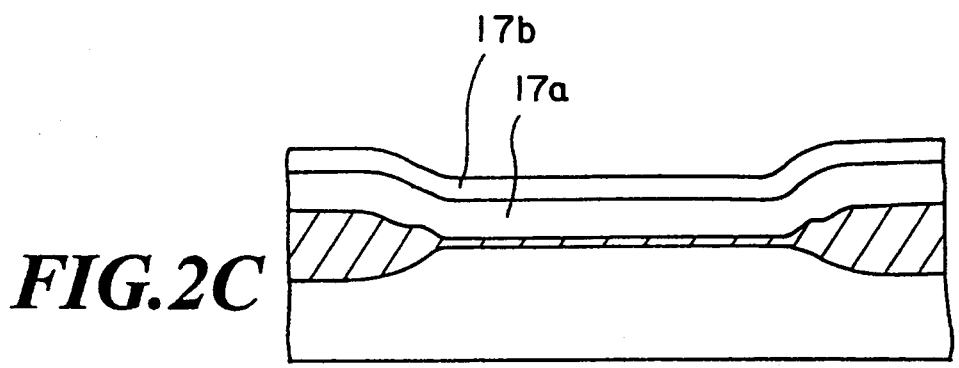

Next, as shown in FIG. 2C, a polycrystalline silicon film (a second semiconductor layer) 17a of about 100 nm in thickness is formed on the gate insulating film 16 and the field insulating film 15 by means of a chemical vapor deposition method using an SiH4 gas.

Then, a tungsten silicide film (WSi) 17b of about 100 nm in thickness is formed on the polycrystalline silicon film 17a by means of the chemical vapor deposition method using an mixed gas of WF6 and SiH4.

Next, after forming an unshown resist mask by means of a photolithographic process, both of the polycrystalline silicon film 17a and the tungsten silicide film 17b are etched on the basis of the resist mask. In this way, a two-layered gate electrode layer (a two-layered electrode layer) 17 composed of a first gate electrode layer (a polycrystalline silicon film; a first electrode layer) 17a and a second gate electrode layer (a tungsten silicide film; a second electrode layer) 17b is formed.

Figure 2D:
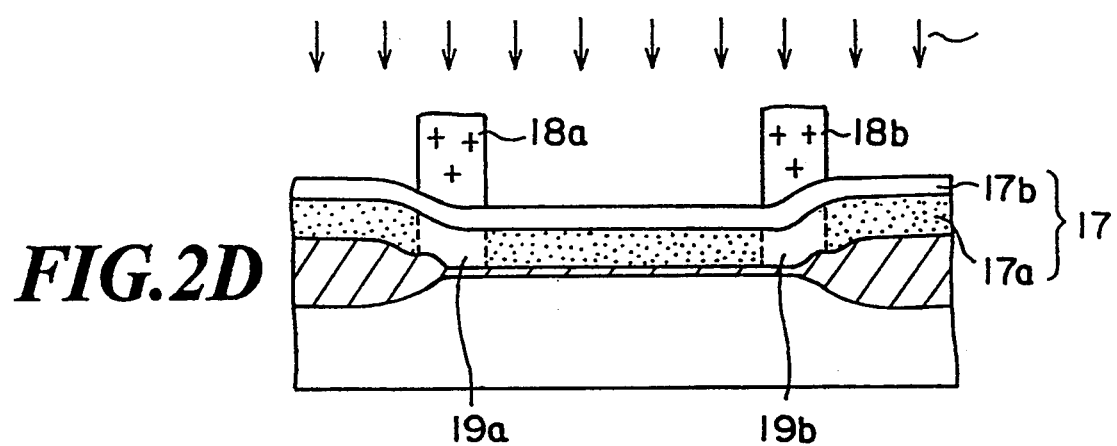

Next, as shown in FIG. 2D, resist masks 18a and 18b are formed on parts of the tungsten silicide film 17b in the boundary regions 13a and 13b between an element forming region 11 and isolation regions 12.

After this, phosphorus (a conductive type impurity) is selectively implanted into the polycrystalline silicon film 17a under a condition of 50 keV in acceleration energy and $4\times10^{15}$ cm$^{-2}$ in dose by means of an ion implantation method on the basis of the resist masks 18a and 18b. Phosphorus is selectively doped into other parts of the polycrystalline silicon film 17a other than the parts in the boundary regions 13a and 13b.

In this manner, the first gate electrode layer 17a is formed. It is higher in resistance in the boundary regions 13a and 13b and is lower in resistance in regions other than the boundary regions 13a and 13b.

The second gate electrode layer 17b serves for electrically connecting each other the lower-resistance parts of the first gate electrode layer 17a which are respectively in both sides of higher-resistance regions 19a and 19b with. In this manner, a specified gate voltage is uniformly applied to the gate electrode layer 17 which is interconnected all over the device.

Next, after removing the resist masks, an interlayer insulating film 20 composed of a silicon oxide film of about 200 nm in thickness is formed by means of the chemical vapor deposition method using a mixed gas of an SiH4 gas and an oxidizing gas.

Next, as shown in FIG. 2E, a viahole 20a is formed in the interlayer insulating film 20 on the gate electrode layer 17.

After this, an aluminum film of about 1 μm in thickness is formed to cover the viahole 20a by means of a vacuum evaporation method. Then, an upper interconnection layer 21 to be connected with the gate electrode layer 17 is formed by patterning the aluminum film. Thereby, an insulated gate field effect transistor is completed.

As mentioned above, in the insulated gate field effect transistor according to the first embodiment, it has the two-layered gate electrode layer 17 which composes of the first gate electrode layer 17a and the second gate electrode layer 17b. And the polycrystalline silicon layer (the first gate electrode layer) 17a is higher in resistance in the boundary regions 13a and 13b and is lower in resistance in regions other than the boundary regions 13a and 13b.

Since higher-resistance parts of the polycrystalline silicon layer 17a in the boundary regions 13a and 13b act as an insulating layer, in the boundary regions 13a and 13b the gate voltage is applied mainly to the second gate electrode layer 17b when a voltage is applied to the gate electrode layer 17. At this time, the higher-resistance parts of the polycrystalline silicon layer 17a and the gate insulating film under them, respectively, act equivalently to capacitors connected in series.

Accordingly, when a gate voltage is applied to the second gate electrode layer 17b, the gate voltage is distributed between the higher-resistance parts of the polycrystalline silicon layer 17a and the gate insulating film 16 according to their respective equivalent capacities.

Therefore, a lower voltage than the whole gate voltage is applied to the gate insulating film 16. Thus, the electric field strength applied to the gate insulating film 16 is considerably weakened in the boundary regions 13a and 13b.

As mentioned above, the first embodiment makes it possible to improve dielectric strength of the insulated gate field effect transistor through weakening the electric field strength in the boundary regions 13a and 13b as well as to improve the film quality of the gate insulating film.

(2) Second embodiment

Figure 3:
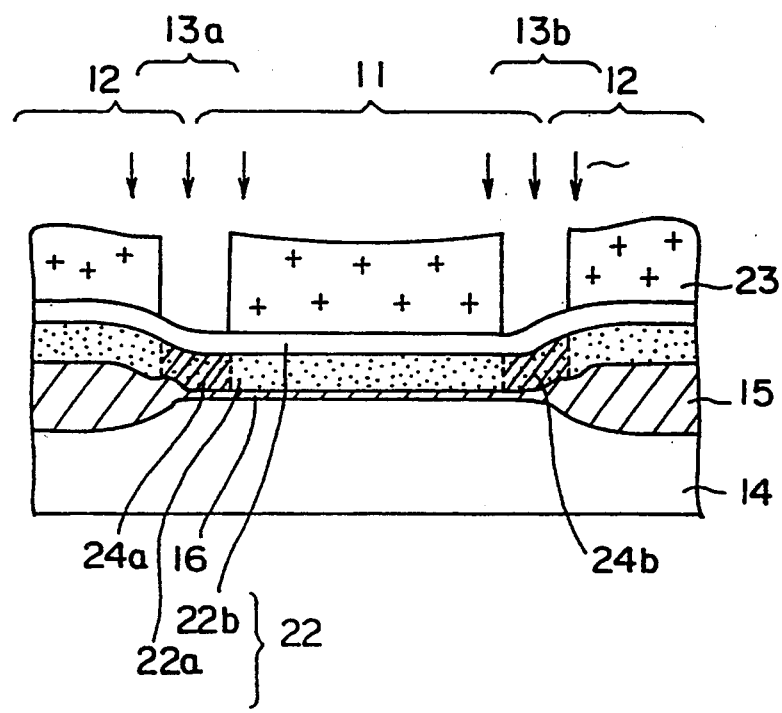
FIG. 3 is a cross-sectional view showing a process of manufacturing an insulated gate field effect transistor according to a second embodiment of the invention.

A second embodiment of the invention is described in the following as referring to FIG. 3. FIG. 3 is a cross-sectional view showing a process of manufacturing an insulated gate field effect transistor according to the second embodiment. Another method of forming a first gate electrode layer 22a which is higher in resistance in the boundary regions 13a and 13b is described in the following.

The second embodiment is distinguished from the first embodiment by a process of compensating the density of N-type impurities in the boundary regions 13a and 13b with P-type impurities after doping the whole semiconductor layer 22a with N-type impurities. By this, in the same manner as the first embodiment, a polycrystalline silicon film (a second semiconductor layer) 22a which makes an approximately intrinsic semiconductor layer or a semiconductor layer of low carrier density in the boundary regions 13a and 13b, and makes a semiconductor layer with lower resistance in regions other than the boundary regions 13a and 13b is formed.

FIG. 3 is a cross-sectional view showing a state after doping with N-type impurities the polycrystalline silicon film 22a which is a lower part of a two-layered gate electrode layer 22 which composes of polycrystalline silicon film (semiconductor layer) 22a and a tungsten silicide (silicide layer) 22b and still before doping it with P-type impurities for compensation.

In this case, phosphorus (one conductive type impurity) has been doped as an N-type impurity under the same condition as the first embodiment. Reference number 23 is a resist mask covering the gate electrode layer 22 except for the boundary regions 13a and 13b.

In such a state as this, boron (a counter conductive type impurity) which is a P-type impurity is selectively implanted into the polycrystalline silicon film 22a under a condition of 20 keV in acceleration energy and $4 \times 10^{15}$ cm$^{-2}$ in dose by means of an ion implantation method on the basis of the resist mask 23. Since the density of phosphorus of N type in the parts of the polycrystalline silicon film 22a in the boundary regions 13a and 13b is compensated by the boron of P type, the parts of the polycrystalline silicon film 22a in the boundary regions 13a and 13b come to be effectively lower in carrier density. In this manner, the first gate electrode layer 22a is formed. It is higher in resistance in the boundary regions 13a and 13b and is lower in resistance in regions other than the boundary regions 13a and 13b.

After this, an insulated gate field effect transistor is completed through the process described as referring to FIG. 2E in the first embodiment.

As mentioned above, in the second embodiment also, in the same manner as the first embodiment, the first gate electrode layer 22a is higher in resistance in the boundary regions 13a and 13b between the field insulating film 15 and the element forming region 11 and is lower in resistance in regions other than the boundary regions 13a and 13b.

In this manner, since the electric field strength applied to the Gate insulating film 16 is weakened, the second embodiment makes it possible to improve dielectric strength of the insulated gate field effect transistor.

(3) Third embodiment

In the first and second embodiments, only the polycrystalline silicon films 19a and 19b, and 24a and 24b in the boundary regions 13a and 13b are made higher in resistance. And the lower-resistance polycrystalline silicon films 17a and 24a are formed respectively in both sides of the higher-resistance regions 19a and 19b, and 24a and 24b. Moreover, the higher-resistance regions 19a and 19b, and 24a and 24b are formed as laterally crossing the gate electrode layers 17 and 22. And the lower-resistance polycrystalline silicon films 17a and 24a separated by the higher-resistance regions 19a and 19b, and 24a and 24b are respectively connected each other through the second Gate electrode layer 17b and 22b.

Figure 4:
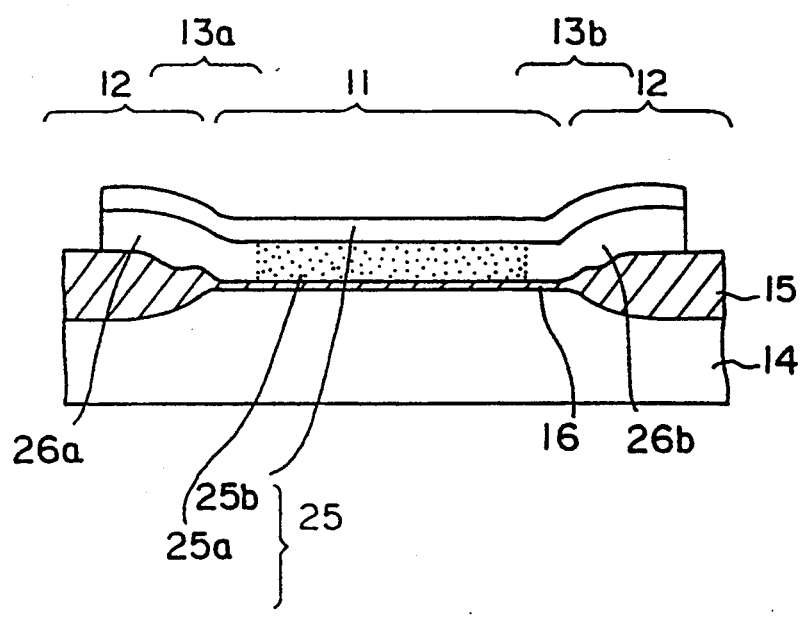
FIG. 4 is a cross-sectional view showing a process of manufacturing an insulated gate field effect transistor according to a third embodiment of the invention.

On the other hand, as shown in FIG. 4, in case that higher-resistance regions 26a and 26b are formed at both sides of the Gate electrode layer 25 along the extended direction of it, the regions outside the boundary regions 13a and 13b in addition to them may be regions without conductive type impurities.

By doing this, since a first gate electrode layer 25a is higher in resistance in the boundary regions 13a and 13b between the field insulating film 15 and the element forming region 11, the electric field strength applied to the gate insulating film 16 is weakened. Thus the third embodiment also makes it possible to improve dielectric strength of the whole insulated gate field effect transistor.

In the above-mentioned embodiments, an N-type polycrystalline silicon film doped with phosphorus is used as the first Gate electrode layers 17a, 22a, and 25a, but an P-type polycrystalline silicon film doped with boron also can be used. In this case, such an N-type impurity as phosphorus is used as a counter conductive type impurity for compensation in the second embodiment. And another semiconductor layer such as a single-crystalline silicon film, an amorphous silicon film, or the like also can be used instead of a polycrystalline silicon film.

Furthermore, arsenic (As) or others instead of phosphorus can be used as an N-type impurity. And gallium (Ga) or others instead of boron can be used as a P-type impurity.

Still further, although a tungsten silicide film is used as the second gate electrode layers 17b, 22b, and 25b, a titanium silicide film, a molybdenum silicide film, a cobalt silicide film, a tantalum silicide film or other silicide films can be used, and conductive films other than silicide films also can be used.

What is claimed is:

1. A semiconductor device comprising:
   a thick insulating film partly formed on a semiconductor substrate;
   an thin insulating film formed on the semiconductor substrate adjacent to the thick insulating film;
   a first electrode layer composed of a semiconductor layer which is formed in a region ranging from the thin insulating film to the thick insulating film and has a higher resistance in a boundary region between the thick insulating film and the thin insulating film and a lower resistance in a region except for the boundary region; and
   a second electrode layer formed on the first electrode layer.

2. A semiconductor device according to claim 1, wherein the thin insulating film is a gate insulating film.

3. A semiconductor device according to claim 1, wherein a two-layered electrode layer composed of the first electrode layer and the second electrode layer is a gate electrode layer.

4. A semiconductor device according to claim 1, wherein the semiconductor substrate is a silicon substrate.

5. A semiconductor device according to claim 4, wherein the thick insulating film is a silicon oxide film formed by selectively oxidizing the silicon substrate.

6. A semiconductor device according to claim 4, wherein the thin insulating film is a silicon oxide film formed by oxidizing the silicon substrate.

7. A semiconductor device according to claim 1, wherein the first electrode layer is composed of one of a single-crystalline silicon film, a polycrystalline silicon film, and an amorphous silicon film.

8. A semiconductor device according to claim 1, wherein the second electrode layer is composed of one of a titanium silicide film, a tungsten silicide film, a molybdenum silicide film, a cobalt silicide film and a tantalum silicide film.

9. A semiconductor device according to claim 1, wherein the semiconductor layer is formed by selectively doping the semiconductor layer with conductive type impurities as masking the part of the semiconductor layer in the boundary region.

10. A semiconductor device according to claim 1, wherein the semiconductor layer is formed by doping the semiconductor layer with one conductive type impurities and then selectively doping the part of the semiconductor layer in the boundary region with counter conductive type impurities with lower density than the doped one conductive type impurities.

11. A semiconductor device according to claim 1, wherein the semiconductor layer in the boundary region is an intrinsic semiconductor layer or a semiconductor layer with lower carrier density than a semiconductor layer except for the boundary region.

12. A semiconductor device according to claim 11, wherein the intrinsic semiconductor layer or the semiconductor layer with lower carrier density is formed by selectively doping the semiconductor layer with conductive type impurities as masking the part of the semiconductor layer in the boundary region.

13. A semiconductor device according to claim 12, wherein the conductive type impurities are borons or phosphorouses.

14. A semiconductor device according to claim 13, wherein the second electrode layer is composed of one of a titanium silicide film, a tungsten silicide film, a molybdenum silicide film, a cobalt silicide film and a tantalum silicide film.

15. A semiconductor device according to claim 11, wherein the intrinsic semiconductor layer or the semiconductor layer with lower carrier density is formed by doping the semiconductor layer with one conductive type impurities and then selectively doping the part of the semiconductor layer in the boundary region with counter conductive type impurities with lower density than the doped one conductive type impurities.

16. A semiconductor device according to claim 15, wherein the one conductive type impurities are borons or phosphorouses and the counter conductive type impurities are phosphorouses or borons.

17. A semiconductor device according to claim 16, wherein the second electrode layer is composed of one of a titanium silicide film, a tungsten silicide film, a molybdenum silicide film, a cobalt silicide film and a tantalum silicide film.

* * * * *